United States Patent
Ding et al.

(10) Patent No.: US 9,404,960 B2
(45) Date of Patent: Aug. 2, 2016

(54) ON CHIP BIAS TEMPERATURE INSTABILITY CHARACTERIZATION OF A SEMICONDUCTOR DEVICE

(71) Applicant: International Business Machines Corporation, Armonk, NY (US)

(72) Inventors: Hanyi Ding, Colchester, VT (US); Xuefeng Liu, South Burlington, VT (US); Alvin W. Strong, Essex Junction, VT (US); Randy L. Wolf, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 255 days.

(21) Appl. No.: 14/041,422

(22) Filed: Sep. 30, 2013

(65) Prior Publication Data

US 2015/0091601 A1    Apr. 2, 2015

(51) Int. Cl.
*G01R 31/26* (2014.01)
*G01R 31/28* (2006.01)

(52) U.S. Cl.
CPC ........ *G01R 31/2628* (2013.01); *G01R 31/2623* (2013.01); *G01R 31/2822* (2013.01)

(58) Field of Classification Search
CPC ........... G01R 31/2623; G01R 31/2628; G01R 31/2822
USPC ................ 324/762.02, 762.09, 537, 750.01; 327/434
See application file for complete search history.

(56) References Cited

U.S. PATENT DOCUMENTS

| | | | |
|---|---|---|---|
| 6,815,970 B2 * | 11/2004 | Rost et al. | 324/762.02 |
| 7,212,023 B2 * | 5/2007 | Krishnan et al. | 324/762.09 |
| 7,562,318 B2 | 7/2009 | Ang et al. | |
| 7,642,864 B2 * | 1/2010 | Chuang et al. | 331/44 |
| 7,808,266 B2 | 10/2010 | Marsall et al. | |
| 7,952,378 B2 | 5/2011 | Marshall et al. | |
| 8,120,356 B2 | 2/2012 | Agarwal et al. | |
| 8,229,683 B2 | 7/2012 | Gebara et al. | |

(Continued)

FOREIGN PATENT DOCUMENTS

CN        102736006 A        4/2011

OTHER PUBLICATIONS

Kuper et al., "MOSFET Degradation Under RF Stress", IEEE Transactions on Electron Devices, vol. 55, No. 11, pp. 3167-3174, Nov. 2008.

*Primary Examiner* — Quan-Zhen Wang
*Assistant Examiner* — Tony Davis
(74) *Attorney, Agent, or Firm* — Michael Lestrange; Andrew M. Calderon; Roberts Mlotkowski Safran Cole & Calderon, P.C.

(57) ABSTRACT

Embodiments of the present invention provide a circuit and method to characterize the impact of bias temperature instability on semiconductor devices. The circuit comprises a transistor having a gate, drain, source, and body terminal. Two AC pad sets each having a plurality of conductive pads. Two DC pads are in communication with a DC supply and/or meter. The gate terminal is in communication with a first conductive pad included in the plurality of conductive pads of each of the AC pad sets. The drain terminal is in communication with a second conductive pad of an AC pad set and the source terminal with a second conductive pad of another AC pad set. One DC pad is in communication with the gate terminal through a first serial resistor and another DC pad with the body terminal through a second serial resistor and provides an open-circuit for the gate and body terminals.

20 Claims, 5 Drawing Sheets

(56) References Cited

U.S. PATENT DOCUMENTS

| | | |
|---|---|---|
| 8,271,254 B2 | 9/2012 | Kinoshita et al. |
| 8,299,809 B2* | 10/2012 | Ting et al. ............... 324/750.03 |
| 9,054,793 B2* | 6/2015 | Cook .................... H04B 17/00 |
| 2003/0233624 A1* | 12/2003 | Reddy et al. ....................... 716/4 |
| 2005/0156605 A1* | 7/2005 | Lee .............................. 324/537 |
| 2005/0278677 A1* | 12/2005 | Ang et al. ........................ 716/9 |
| 2006/0267621 A1* | 11/2006 | Harris et al. ................. 324/765 |
| 2007/0126446 A1* | 6/2007 | Szmyd ......................... 324/760 |
| 2009/0167429 A1* | 7/2009 | Reddy et al. ..................... 330/2 |
| 2009/0267634 A1 | 10/2009 | Nada et al. |
| 2010/0318313 A1* | 12/2010 | Agarwal et al. ............... 702/117 |
| 2011/0051300 A1* | 3/2011 | Thijs et al. ...................... 361/56 |
| 2011/0248771 A1* | 10/2011 | Madan et al. ................. 327/434 |
| 2013/0015876 A1 | 1/2013 | Lai et al. |
| 2013/0200908 A1* | 8/2013 | Huebschman ........... 324/750.01 |
| 2013/0257454 A1* | 10/2013 | Mow et al. .................... 324/619 |
| 2014/0002935 A1* | 1/2014 | Chen et al. ....................... 361/56 |
| 2014/0184262 A1* | 7/2014 | Poindexter et al. ...... 324/759.03 |
| 2014/0278197 A1* | 9/2014 | Yen et al. ...................... 702/117 |
| 2014/0282335 A1* | 9/2014 | Huang ......................... 716/113 |

\* cited by examiner

ON CHIP BIAS TEMPERATURE INSTABILITY CHARACTERIZATION OF A SEMICONDUCTOR DEVICE

BACKGROUND

The present disclosure relates generally to the field of semiconductor device reliability testing, and more particularly to characterizing the impact of bias temperature instability on threshold voltage degradation of semiconductor devices that operate in the radio frequency range. Complementary metal-oxide-semiconductor (hereinafter "CMOS") technology is utilized for constructing integrated circuits wherein complementary and symmetrical pairs of p-type and n-type metal oxide semiconductor field effect transistors are typically utilized for logic functions.

The application of CMOS technology in radio-frequency (hereinafter "RF") integrated circuits has developed due to their low cost and broad applications, for example, switches and power amplifiers. Such devices can experience large RF swing voltages, which can exceed their maximum allowed DC bias voltage and result in device life-time reduction. Bias temperature instability (hereinafter "BTI") is a CMOS device reliability failure mechanism, which typically results from high gate to source/drain bias at elevated temperature. BTI effects includes negative bias temperature instability (hereinafter "NBTI") and positive bias temperature instability (hereinafter "PBTI").

NBTI effects are seen when a negative gate voltage stress is applied to a p-channel CMOS transistor, and the effects diminish rapidly during the recovery time immediately following the removal of the stress. Similarly, PBTI effects are seen in N-channel CMOS devices, particularly in those with high-k gate dielectrics. The reliability of RF CMOS integrated circuits may be addressed by stressing the device under RF power and characterizing, for example, hot carrier transport behavior, gate dielectric damage, and device failure mechanisms. However, traditional RF characterization methods for RF stress testing involve complicated tuning and calibrations and are difficult to develop. The typical set up for RF characterization utilizes a six (6) pad RF structure and two Ground-Signal-Ground probes, wherein a signal pad is in communication with the gate and drain terminals of the transistor, and wherein the source and drain terminals therein are grounded. However, the typical configuration setup required for RF characterization will not support RF stressing, which requires that the source and body terminals are in communication with a signal pad.

SUMMARY

Embodiments of the present invention provide a circuit and method to characterize the impact of bias temperature instability on threshold voltage degradation of semiconductor devices that operate in the radio frequency range. In certain embodiments, the circuit comprises a transistor having a gate, drain, source, and body terminal. Two AC pad sets each having a plurality of conductive pads. Two DC pads configured to be in communication with a DC supply and/or meter. The gate terminal is configured to be in communication with a first conductive pad included in the plurality of conductive pads of each of the AC pad sets. The drain terminal is configured to be in communication with a second conductive pad of an AC pad set. The source terminal is configured to be in communication with a second conductive pad of another AC pad set. One DC pad is in communication with the gate terminal through a first serial resistor and another DC pad is in communication with the body terminal through a second serial resistor and provides an open-circuit for the gate and body terminals.

DETAILED DESCRIPTION

Figure 1:
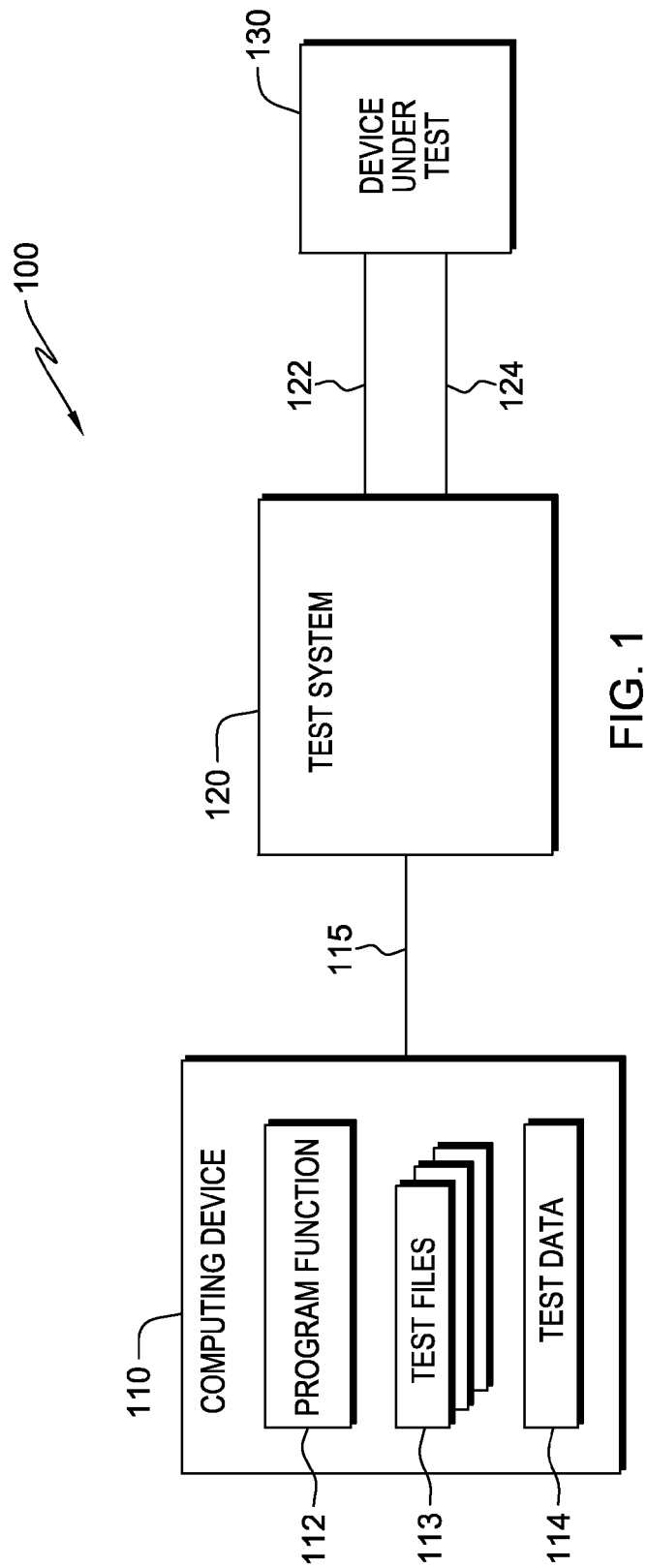
FIG. 1 is a block diagram illustrating an environment, in accordance with an embodiment of the present invention.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Bias temperature instability (hereinafter "BTI") is a complementary metal-oxide-semiconductor (hereinafter "CMOS") device reliability failure mechanism, which typically results from high gate to source/drain bias at elevated temperature. NBTI effects are seen when a negative gate voltage stress is applied to a p-channel CMOS transistor, and the effects diminish rapidly during the recovery time immediately following the removal of the stress. Similarly, PBTI effects are seen in N-channel CMOS devices, particularly in those with high-k gate dielectrics. The reliability of radio frequency (hereinafter "RF") CMOS integrated circuits may be addressed by stressing the device under RF power and characterizing device failure mechanisms, such as BTI. Embodiments of the present invention will now be described in detail with reference to the Figures.

FIG. 1 is a block diagram illustrating an environment, generally designated 100, in accordance with one embodiment of the present invention. Environment 100 is an environment wherein the impact of BTI on RF CMOS threshold voltage degradation is characterized, in accordance with an embodiment of the present invention. Environment 100 includes computing device 110, test system 120, and device under test 130. Computing device 110 is in communication with test system 120 via communications line 115. Computing device 110 is a computing device that controls test system 120 (discussed further below). Computing device 110 includes program function 112, test files 113, and test data 114.

In an embodiment, program function 112, test files 113, and/or test data 114 are stored on an external storage device, such as external storage devices 518. Computing device 110 can transmit instructions to test system 120. Computing device 110 can transmit data to and/or receive data from test system 120 via communications line 115. In general, computing device 110 can be any computing device capable of characterizing the impact of BTI on RF CMOS threshold voltage degradation, executing program function 112, and communicating with test system 120, in accordance with an embodiment of the present invention.

Program function 112 is software that characterizes the impact of BTI on RF CMOS threshold voltage degradation. In large signal applications, such as switches and power amplifiers, device reliability is influenced by large RF swing voltages, which can exceed the maximum allowed DC bias voltage and may result in accelerated device degradation. Hence, characterization of the influence of RF swing voltage on device reliability can increase the accuracy of device life model predictions.

Program function 112 can transmit, via computing device 110, information to test system 120. Program function 112 can receive, via computing device 110, information from test system 120. Program function 112 can determine BTI associated with device under test 130 (hereinafter "DUT"). Program function 112 can generate scattering parameters (hereinafter "S-parameters") associated with DUT 130. Program function 112 can generate a DC characterization of DUT 130. Program function 112 can generate a lifetime model of DUT 130 using S-parameter and/or DC characterization information. Program function 112 can determine threshold voltages that are associated with DUT 130. In general, program function 112 is any software that performs RF stress procedures and collects data, in accordance with an embodiment of the present invention.

In an embodiment, test files 113 include calibration and testing instructions, which define the calibration of test system 120 and the testing of DUT 130, respectively. In an embodiment, the testing instructions included test files 113 included instructions for determining S-parameters, DC characterization, and RF stress. In another embodiment, test data 114 includes current and voltage measurement and/or reading files transmitted by test system 120, via communications line 115, to computing device 110 during testing of DUT 130. Test system 120 is in communication with computing device 110, via communication lines 115, and DUT 130, via test input line 122 and test output line 124, in accordance with an embodiment of the present invention. Test system 120 can perform gate-drain and/or gate-source voltage sweeps of DUT 130. Test system 120 can generate a RF signal. DUT 130 is a semiconductor device that operates in the radio frequency range.

Figure 2:
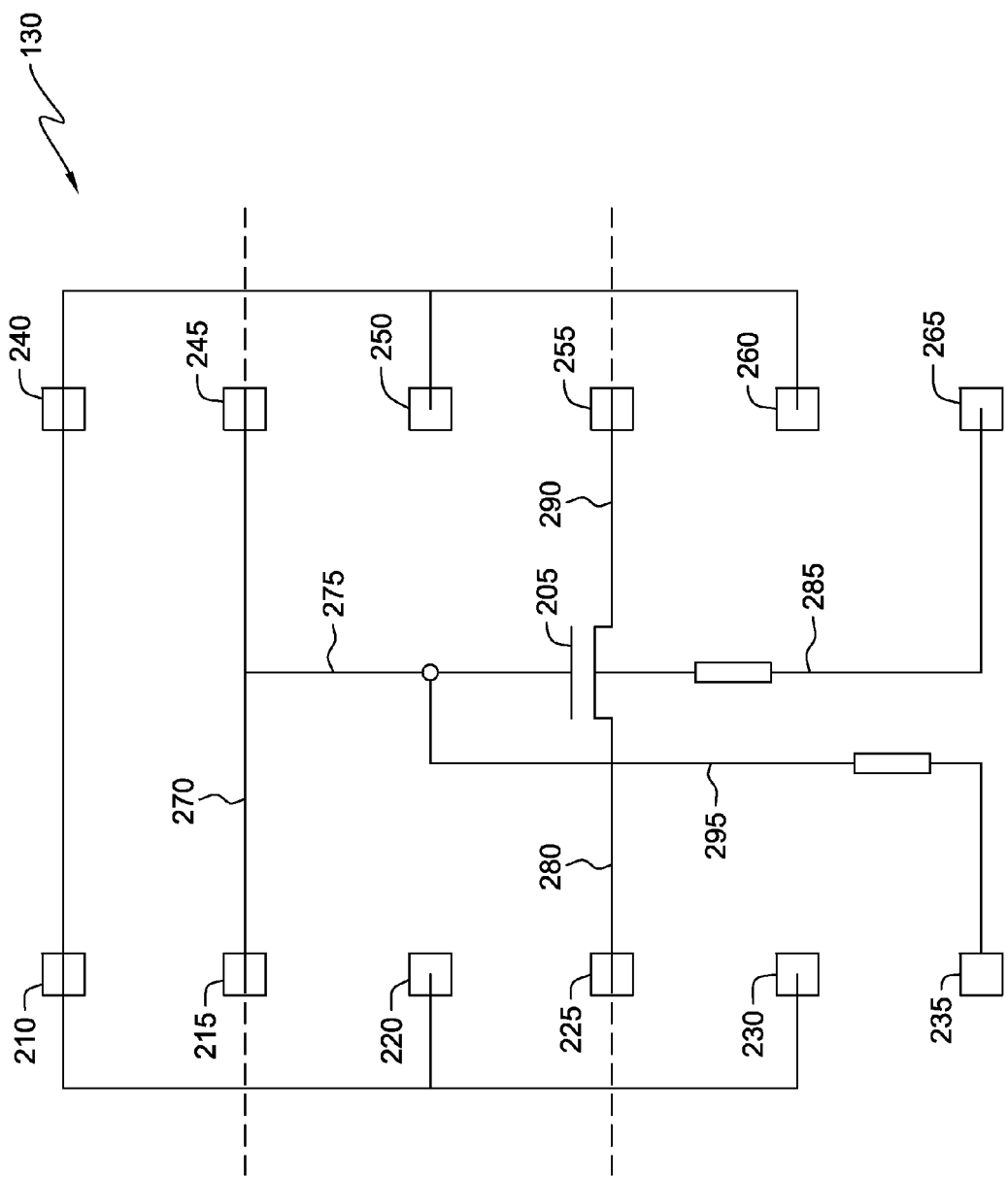
FIG. 2 illustrates a circuit layout of a device under test, in accordance with an embodiment of the present invention.

FIG. 2 illustrates a circuit layout structure of DUT 130, in accordance with an embodiment of the present invention.

Specifically, FIG. 2 illustrates a four RF port, twelve pad RF stress circuit layout. Two of the four RF ports allow RF power to be delivered to one side at a terminal and received at a different (hereinafter "second") port on the same terminal. The other two ports of the four RF ports allow the required RF terminations to be set during stressing and testing, as well as the required biasing and testing to be preformed. DUT 130 includes transistor 205, which is a field effect transistor (hereinafter "FET"), such as a metal oxide semiconductor field effect transistor (hereinafter "MOSFET").

Transistor 205 includes a source, gate, drain, and body terminals. DUT 130 includes two alternating current (hereinafter "AC") pad sets in a ground-signal-ground-signal-ground (hereinafter "GSGSG") configuration that are oriented in parallel, which allow for both RF and direct current (hereinafter "DC") stress and testing to be conducted on DUT 130 without switching the probe set up. The GSGSG pad sets include ground pads 210, 220, 230, 240, 250, and 260, which are in communication with each other. The GSGSG pad sets also include signal pads 215, 225, 245, and 255. The addition of signal pads 215 and 240 allow transistor 205 to undergo both RF stressing and characterization (discussed below) without changing the configuration of the pad set up. Typically, conventional methods utilize different pad structures for RF stressing and RF characterization.

Signal pads 215 and 245 are in communication with each other as well as the gate terminal of transistor 205. In an embodiment, signal pad 225 is in communication with the source terminal of transistor 205. In another embodiment, signal pad 225 is in communication with the drain terminal of transistor 205, via line 280. In yet another embodiment, signal pad 255 is in communication with the drain terminal of transistor 205, via line 280. In yet still another embodiment, signal pad 255 is in communication with the source terminal of transistor 205, via line 290. In other embodiments, signal pad 255 is in communication with the drain terminal of transistor 205, via line 290. DUT 130 also includes direct current DC pads 235 and 265 for connection to a DC supply.

DC pad 235 is in communication with the gate terminal of transistor 205, through serial resistor 296, and lines 295 and 275. Signal pads 215 and 245 are in communication with each other via line 270. Signal pads 215 and 245 are also in communication with the gate terminal of transistor 205 via lines 270 and 275. DC pad 265 is in communication with the body terminal of transistor 205 through serial resistor 286, and line 285. In general, DUT 130 can be any device that includes two GSGSG pad sets and two DC pads, in accordance with an embodiment of the present invention. Hence, the circuit depicted by DUT 130 is a Ground-Signal-Ground-Signal-Ground configuration with two AC pad sets that each have five (5) pads in parallel and two (2) additional DC pads. The twelve (12) pad structure of DUT 130 is configured to support both RF stressing and RF characterization without the need to change the pad set up.

Figure 3:
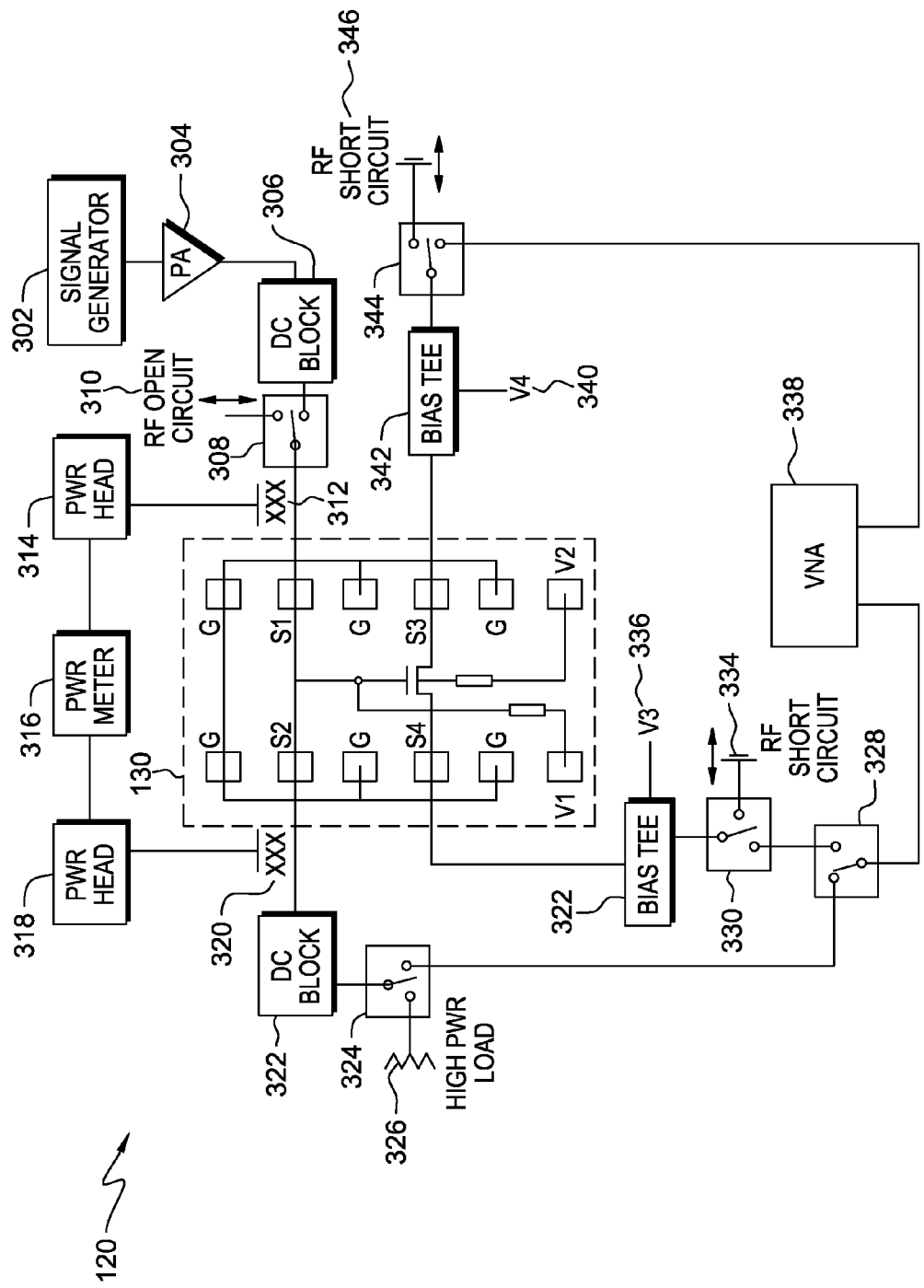
FIG. 3 illustrates a block diagram of a system, in accordance with an embodiment of the present invention.

FIG. 3 illustrates a block diagram of a test system, generally 120, in accordance with an embodiment of the present invention. Test system 120 is utilized to characterize device reliability under RF stress conditions. Test system 120 includes signal generator 302, which generates different RF frequencies at different powers. Signal generator 302 is in communication with power amplifier 304, which is an electronic amplifier that converts low-power RF signals generated by signal generator 302 into a larger signal of significant power. In an embodiment, the power required for test system 120 is greater than the maximum power that can be generated by signal generator 302. Power amplifier 304 is in communication with DC block 306, which prevents the flow of DC current while allowing the RF signal generated by signal generator 302 to flow to, for example, switch 308.

Switch 308 is a single pole double throw switch assembly that is in communication with DC block 306, RF open circuit tuner 310 and directional coupler 312. In an embodiment, the common terminal of switch 308 is connected to directional coupler 312. Directional coupler 312 couples power flowing to signal pad 245. RF open circuit tuner 310 is in communication with a terminal of switch 308. RF open circuit tuner 310 is a tuner that provides an RF open circuit condition up to signal pad 245 during testing, in accordance with an embodiment of the present invention. Directional coupler 312 is a directional coupler that is in communication with switch 308, power head, and signal pad 245. Power head 314 is in communication with power meter 316. Power head 314 senses power transmissions to pads, for example, signal pad 245. Power meter 316 measures the power received by directional coupler 312, which is proportional to the power delivered to the pad 245.

A DC power supply (not shown) supplies voltage to voltage inputs V1, V2, V3, and V4. In an embodiment, the DC power supply includes a DC voltage meter and DC current meter. Test system 120 also includes RF short circuit tuner 346, which is a tuner that provides RF short circuit condition up to signal pad 255 and is in communication with a terminal of switch 344. Switch 344 is a single pole double throw switch assembly that is in communication with RF short circuit tuner 346, bias tee 342, and vector network analyzer 338. Bias tee 342 is a three port network that is in communication with voltage input V4 and signal pad 255. Bias tee 342 is also in communication with the common terminal of switch 344. Bias tee 342 restricts the DC bias applied to signal pad 255, but not that of switch 344.

Vector network analyzer 338 is in communication with a terminal included in switch 344 and the common terminal of switch 328. Switches 344 and 328 are single pole double throw switch assemblies. Vector network analyzer 338 includes first and second ports that are in communication with switches 328 and 344, respectively. Vector network analyzer is a multiport vector network analyzer. Vector network analyzer 338 collects RF performance data and measures both amplitude and phase properties.

Switch 328 is in communication with switches 330 and 324, which are also single pole double throw switch assemblies. The common terminal of switch 330 is in communication with bias tee 332, while one terminal included therein is in communication with RF short circuit tuner 334 and the other is in communication with a terminal included in switch 328. RF short circuit tuner 334 is a tuner, for example, that provides an RF short circuit up to signal pad 225. Bias tee 332 is a three port network that is also in communication with voltage input V3 and signal pad 225. A terminal included in switch 324 is in communication with high power load 326, another terminal included therein is in communication with a terminal included in switch 328, and its common terminal is in communication with DC block 322.

DC block 322 is in communication with directional coupler 320 and switch 324, in accordance with an embodiment of the present invention. DC block 322 is a DC block, which blocks the flow of DC and low frequencies, e.g. frequency lower than several kilohertz while offering minimum interference to an RF signal. High power load 326 is a high power rating RF termination that provides matching termination to signal pad 215 during RF stress. In an embodiment, high power load 326 can be a resistor, such as a 50 ohm RF resistor. Directional coupler 320 is in communication with DC block 322 and signal pad 215. Directional coupler 320 is a directional coupler that couples power flowing to DC block 322 from signal pad 215.

As reflected below, test system 120 allows for both RF and DC stress and testing to be conducted without switching the probe setup. Test system 120 also allows for RF power to be delivered to one side at a terminal and received at a different port on the same terminal. In addition, test system 120 receives DC bias through a separate port with a serial large resistor, which allows DC bias to not affect the port RF impedance. In an embodiment, DC bias is applied to signal pad 215 or 245 by replacing DC block 322 or 306 by a bias tee. Hence, test system 120 is configured to support both RF stressing and RF characterization by utilizing switches (discussed below) as opposed to opposed to changing the configuration of the pad set.

Figure 4:
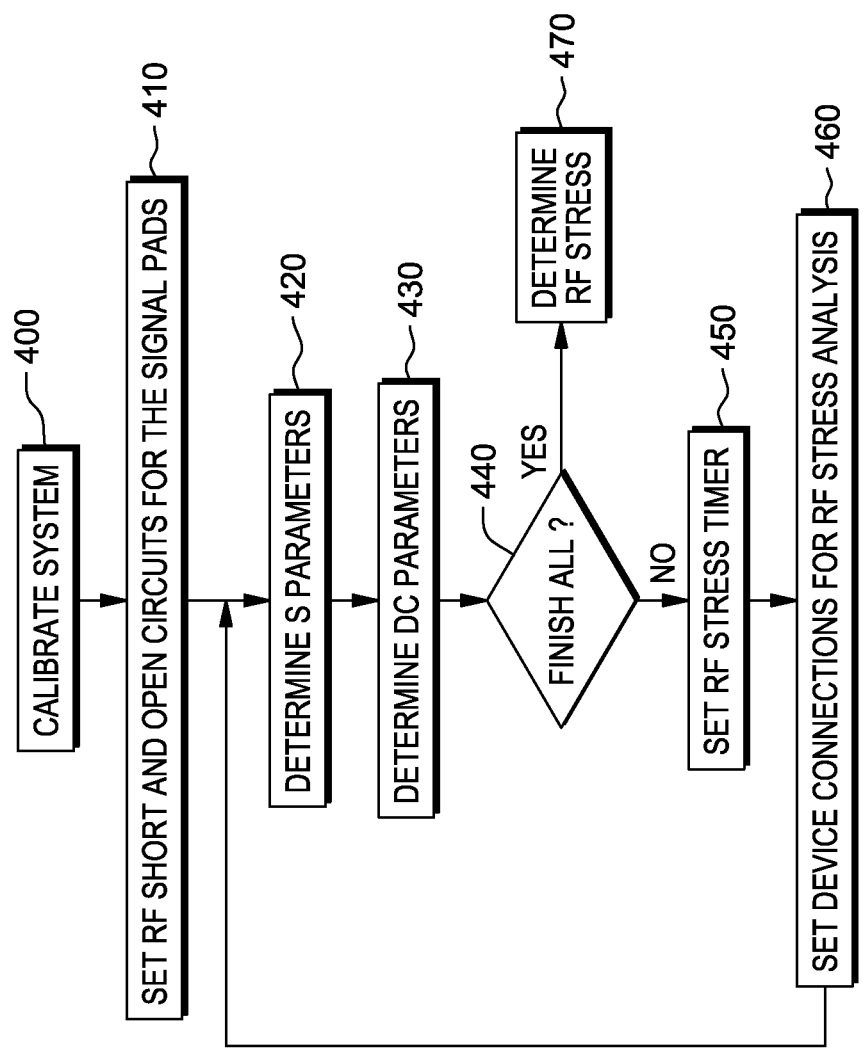
FIG. 4 is a flowchart depicting the operational steps of a program function, in accordance with an embodiment of the present invention.

FIG. 4 is a flowchart depicting the operational steps of program function 112 for characterizing the impact of BTI on RF FET threshold voltage degradation, in accordance with an embodiment of the present invention. Program function 112 calibrates test system 120 (step 400). In an embodiment, program function 112 executes the calibration instructions that are included in test files 113, which instruct test system 120 to calibrate the power levels of signal generator 302 and power amplifier 304, RF path from VNA 338 to signal pad 215, RF path from VNA 338 to signal pad 225, RF path from VNA to signal pad 255, and/or RF path from signal pad 215 to VNA 338 to signal pad 255.

Program function 112 sets RF short and open circuits for the signal pads (step 410). For example, program function 112 executes the testing instructions that are included in test files 113, which instruct test system 120 to set switch 344 to RF short circuit tuner 346 and switch 330, whose common terminal is in communication with bias tee 332, to one of ports of VNA 338 through switch 328. Program function 112 makes a determination of the short circuit condition at signal pad 255 using VNA 338 and adjusting RF short circuit tuner 346. Similar procedures can be applied to tune RF short circuit tuner 334 for signal pad 225 short circuit condition and to tune RF open circuit tuner 310 for signal pad 235 open circuit condition.

Program function 112 determines scatter (hereinafter "S") parameters (step 420). For example, program function 112 executes the testing instructions that are included in test files 113, which instruct test system 120 to set switch 308 to RF open circuit tuner 310, which has been tuned to provide an RF open circuit condition at signal pad 245, set switch 330 to RF short circuit tuner 334, which has been tuned to provide an RF short circuit condition at signal pad 235 (hereinafter "initial setup"), and biases voltage inputs V1 and V4 as needed, and determines the S parameters associated with FET 205 by toggling switch 344 to port 2 of vector network analyzer 338, switch 324 to switch 328, switch 328 to switch 324, and using the information generated by vector network analyzer 338.

In an embodiment, program function 112 determines S parameters using an appropriate statistical method. Program function 112 determines DC parameters (step 430). For example, starting from the initial set up, program function 112 executes the testing instructions that are included in test files 113, which determine the DC parameters associated with FET 205 by transmitting instructions to test system 120 to take voltage and current measurements at desired time intervals while applying predetermined quantities of voltage to voltage inputs V1 and V4.

If program function 112 is finished stressing and testing ("yes" branch decisional 440), then program function 112 determines RF stress (step 470). However, if program function 112 is not finished stressing and testing ("no" branch decisional 440), then program function 112 sets the RF stress timer (step 450). Program function 112 sets test system 120 connections for RF stress analysis (step 460). For example, program function 112 executes the testing instructions that are included in test files 113, which instruct test system 120 to toggle switch 324 to high power load 326, switch 308 to DC block 306, switch 344 to RF short circuit tuner 346, switch 330 to RF short circuit tuner 334, and generate the desired signal via signal generator 302. Program function 112 then records RF stress impacts by performing 420 and 430.

In an embodiment, to apply RF power stress on the gate terminal of transistor 205 program function 112 executes the testing instructions that are included in test files 113, which instruct test system 120 to set voltage inputs V3 and V4 to zero (0). In another embodiment, to apply DC stress program function 112 executes the testing instructions that are included in test files 113, which instruct test system 120 to set the voltage gate bias, voltage drain bias, voltage source bias, and voltage body bias from voltage inputs V1, V4, V3, and V2 respectively. In certain embodiments, stress DC voltage input V2 is grounded or has a negative bias. Subsequent to performing step 460, program function 112 returns to step 420 (described above).

Figure 5:
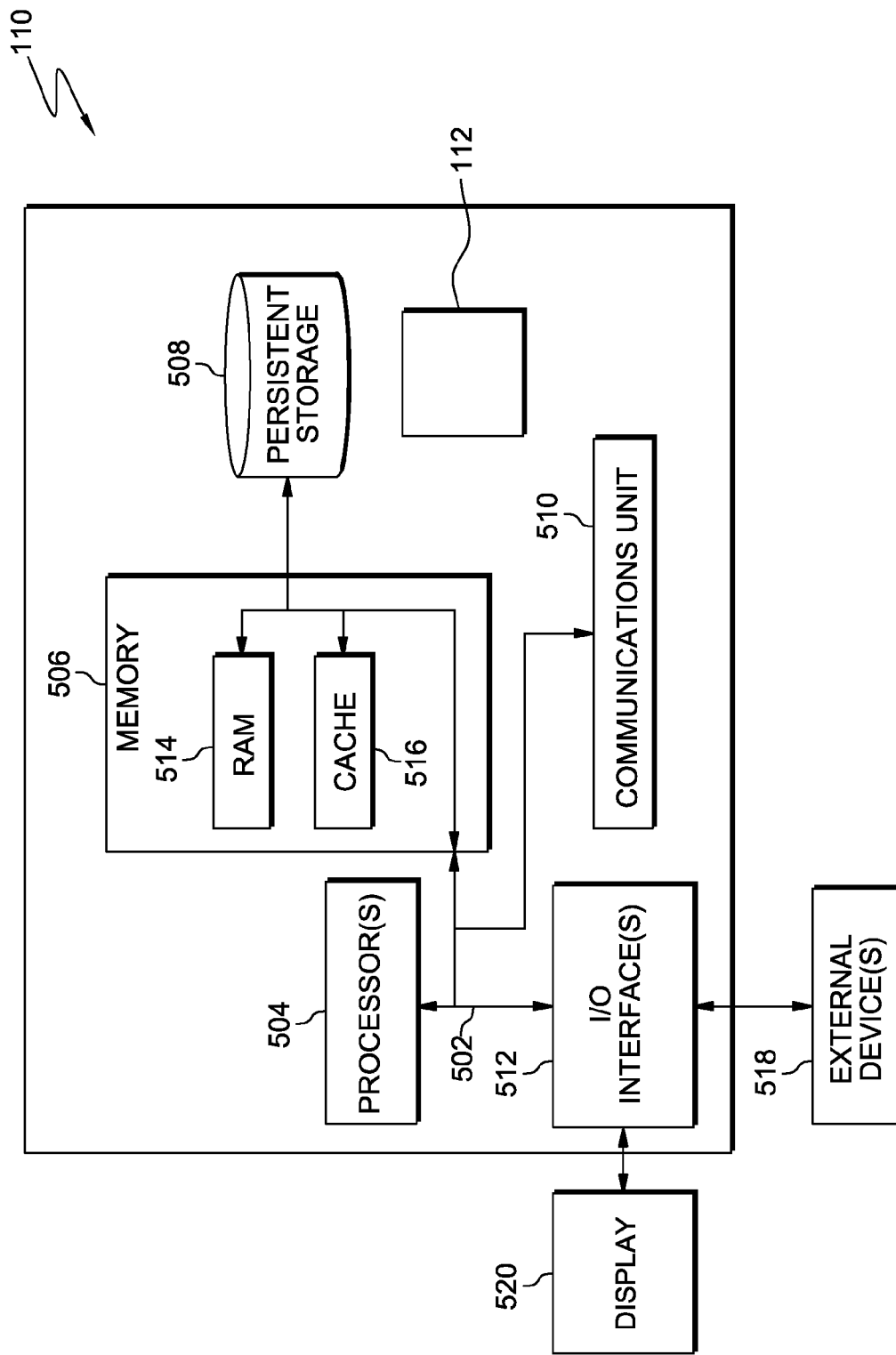
FIG. 5 depicts a block diagram of components of a computing device, in accordance with an embodiment of the present invention.

FIG. 5 depicts a block diagram of components of computing device 110, in accordance with an illustrative embodiment of the present invention. It should be appreciated that FIG. 5 provides only an illustration of one implementation and does not imply any limitations with regard to the environments in which different embodiments may be implemented. Many modifications to the depicted environment may be made.

Computing device 110 includes communications fabric 502, which provides communications between computer processor(s) 504, memory 506, persistent storage 508, communications unit 510, and input/output (I/O) interface(s) 512. Communications fabric 502 can be implemented with any architecture designed for passing data and/or control information between processors (such as microprocessors, communications and network processors, etc.), system memory, peripheral devices, and any other hardware components within a system. For example, communications fabric 502 can be implemented with one or more buses.

Memory 506 and persistent storage 508 are computer-readable storage media. In this embodiment, memory 506 includes random access memory (RAM) 514 and cache memory 516. In general, memory 506 can include any suitable volatile or non-volatile computer-readable storage media.

Program function 112 is stored in persistent storage 508 for execution by one or more of the respective computer processors 504 via one or more memories of memory 506. In this embodiment, persistent storage 508 includes a magnetic hard disk drive. Alternatively, or in addition to a magnetic hard disk drive, persistent storage 508 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 508 may also be removable. For example, a removable hard drive may be used for persistent storage 508. Other examples include optical and magnetic disks, thumb drives, and smart cards that are inserted into a drive for transfer onto another computer-readable storage medium that is also part of persistent storage 508.

Communications unit 510, in these examples, provides for communications with other data processing systems or devices. In these examples, communications unit 510 includes one or more network interface cards. Communications unit 510 may provide communications through the use of either or both physical and wireless communications links. Program function 112 may be downloaded to persistent storage 508 through communications unit 510.

I/O interface(s) 512 allows for input and output of data with other devices that may be connected to computing device 110. For example, I/O interface 512 may provide a connection to external devices 518 such as a keyboard, keypad, a touch screen, and/or some other suitable input device. External devices 518 can also include portable computer-readable storage media such as, for example, thumb drives, portable optical or magnetic disks, and memory cards. Software and data used to practice embodiments of the present invention, e.g., program function 112, can be stored on such portable computer-readable storage media and can be loaded onto persistent storage 508 via I/O interface(s) 512. I/O interface(s) 512 also connects to a display 520. Display 520 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A circuit comprising:
a transistor having a gate, drain, source, and body terminal;
two AC pad sets, wherein each pad set includes a plurality of conductive pads;
two DC pads configured to be in communication with a DC power supply or meter; and wherein:
the gate terminal is configured to be in communication with a first conductive pad included in the plurality of conductive pads of each of the AC pad sets;
the drain terminal is configured to be in communication with a second conductive pad of an AC pad set;
the source terminal is configured to be in communication with a second conductive pad of another AC pad set;
one DC pad is in communication with the gate terminal through a first serial resistor and another DC pad is in communication with the body terminal through a second serial resistor and provides an open-circuit for the gate and body terminals; and
a plurality of switches are configured to allow for radio frequency (RF) stressing and RF characterization of the transistor without modifying a setup of the AC pad sets and the DC pads,
wherein at least one of the plurality of switches is connected to a bias tee that restricts a DC bias.

2. The circuit of claim 1, wherein the two AC pad sets are configured to conform to ground-signal-ground-signal-ground tip probes.

3. The circuit of claim 1, wherein the circuit is configured to allow for the characterization of bias temperature instability associated with the transistor.

4. The circuit of claim 1, wherein the circuit is configured to allow for either the characterization of a scattering parameter associated with the transistor and/or DC characterization of the transistor.

5. The circuit of claim 4, wherein the circuit is configured to allow for the characterization of a lifetime model of the transistor using information associated with the scattering parameter and/or the DC characterization.

6. The circuit of claim 1, wherein the circuit is configured to allow for a gate-drain or gate-source voltage sweep of the transistor to determine a threshold voltage.

7. A method for stress testing a transistor formed in a semiconductor wafer, the method comprising:
providing, in said semiconductor wafer, two AC pad sets each having a plurality of AC pads each and one DC pad set having a plurality of DC pads that are formed in the semiconductor wafer and are in communication with structures of the transistor;
providing a plurality of switches that are in communication with pads included in the two AC pad sets;
configuring a first select plurality of switches of the plurality of switches for enabling application of a predetermined stress signal to a pad included in the plurality of AC pads;
removing the application of the predetermined stress signal;
configuring a second select plurality of switches of the plurality of switches for enabling characterization of a scattering parameter associated with the transistor; and
configuring a third select plurality of switches of the plurality of switches for enabling DC characterization of the transistor,
wherein the plurality of switches are configured to allow for stressing, DC characterization, and characterization of the scattering parameter of the transistor without modifying a setup of the AC pad sets and the DC pad set,
wherein at least one of the plurality of switches is connected to a bias tee that restricts a DC bias applied to at least one of the plurality of AC pads.

8. The method of claim 7, wherein a first pad included in each plurality of AC pad sets is in communication with a gate terminal of the transistor, a second pad included in a first plurality of AC pad sets is in communication with a source terminal of the transistor, and a second pad included in a second plurality of AC pad sets is in communication with a drain terminal of the transistor.

9. The method of claim 7, wherein the characterizing of the scattering parameter includes the use of a two-port vector network analyzer configured to have a first port in communication with a DC block that is configured to be in communication with a gate terminal of the transistor and a second port that is configured to be in communication with the bias tee that is configured to be in communication with a drain terminal of the transistor, wherein the vector network analyzer is configured to apply a test frequency to the transistor via the first or second port and generate a scattering parameter.

10. The method of claim 7, wherein the two AC pad sets conform to ground-signal-ground-signal-ground tip probes.

11. The method of claim 7, wherein the application of the predetermined stress signal to the pad includes performing a gate-drain or gate-source voltage sweep of the transistor to determine a threshold voltage.

12. The method of claim 7, further comprising characterizing a lifetime model of the transistor using information associated with the scattering parameter and/or the DC characterization.

13. The method of claim 7, further comprising characterizing bias temperature instability associated with the transistor.

14. The method of claim 8, wherein the first pad included in each plurality of AC pads sets are also each in communication with a directional coupler that couples power to the first pad.

15. The method of claim 7, wherein the predetermined stress signal is a predetermined radio frequency signal.

16. A computer system to stress test a transistor formed in a semiconductor wafer, the computer system comprising:
one or more computer processors;
one or more computer-readable storage media;
program instructions stored on the computer-readable storage media for execution by at least one of the one or more processors, the program instructions comprising:
program instructions to
provide, in said semiconductor wafer, a connection between the transistor and two AC pad sets each having a plurality of AC pads each;
provide a connection between the transistor and one DC pad set having a plurality of DC pads;
provide a connection a plurality of switches that are in communication with pads included in the two AC pad sets;
configure a first select plurality of switches for enabling application of a predetermined stress signal to a pad included in the plurality of AC pads for a predetermined time period;
remove the application of the predetermined stress signal;
configure a second select plurality of switches of the plurality of switches for enabling the one or more processors to execute program instructions to characterize a scattering parameter associated with the transistor; and
configure a third select plurality of switches of the plurality of switches for enabling the one or more processors to execute program instructions to DC characterize the transistor,
wherein the plurality of switches are configured to allow for stressing, DC characterization, and characterization of the scattering parameter of the transistor without modifying a setup of the AC pad sets and the DC pad set,
wherein at least one of the plurality of switches is connected to a bias tee that restricts a DC bias applied to at least one of the plurality of AC pads.

17. The computer system of claim 16, wherein a first pad included in each plurality of AC pad sets is in communication with a gate terminal of the transistor, a second pad included in a first plurality of AC pad sets is in communication with a source terminal of the transistor, and a second pad included in a second plurality of AC pad sets is in communication with a drain terminal of the transistor.

18. The computer system of claim 16, wherein the characterizing of the scattering parameter includes the use of a two-port vector network analyzer that is configured to have a first port in communication with a DC block that is configured to be in communication with a gate terminal of the transistor and a second port that is configured to be in communication with the bias tee that is configured to be in communication with a drain terminal of the transistor, wherein the vector network analyzer is configured to apply a test frequency to the transistor via the first or second port and generate a scattering parameter.

19. The computer system of claim 16, wherein the two AC pad sets conform to ground-signal-ground-signal-ground tip probes.

20. The computer system of claim 16, wherein the DC characterization includes a gate-drain and/or gate-source voltage sweep of the transistor to enable determination of a threshold voltage.

* * * * *